United States Patent
Retseptor

[19]

[11] Patent Number: 6,144,547
[45] Date of Patent: Nov. 7, 2000

[54] MINIATURE SURFACE MOUNT CAPACITOR AND METHOD OF MAKING SAME

[75] Inventor: Gennady Retseptor, Bet Shemesh, Israel

[73] Assignee: AVX Corporation, Myrtle Beach, S.C.

[21] Appl. No.: 09/198,555

[22] Filed: Nov. 23, 1998

Related U.S. Application Data

[60] Provisional application No. 60/066,505, Nov. 24, 1997.

[51] Int. Cl.[7] .................................................. H01G 4/005
[52] U.S. Cl. .................. 361/303; 361/308.1; 361/321.1; 361/306.1
[58] Field of Search .............................. 361/306.1, 306.2, 361/306.3, 303, 301.1, 308.1, 308.2, 309, 310, 320, 321.1, 321.2, 321.3, 321.4, 321.5

[56] References Cited

U.S. PATENT DOCUMENTS

| | | | |
|---|---|---|---|
| 3,710,211 | 1/1973 | Behn et al. | 361/309 |
| 3,731,354 | 5/1973 | Rayburn . | |
| 4,424,615 | 1/1984 | Wakino . | |
| 4,453,199 | 6/1984 | Ritchie et al. . | |
| 4,561,954 | 12/1985 | Scrantom et al. . | |
| 4,604,676 | 8/1986 | Senda et al. . | |
| 4,615,908 | 10/1986 | Behn et al. . | |
| 4,618,911 | 10/1986 | Chichanowski et al. | 361/308 |
| 4,633,366 | 12/1986 | Maher . | |
| 5,018,048 | 5/1991 | Shaw et al. . | |
| 5,040,092 | 8/1991 | Katho et al. . | |
| 5,122,923 | 6/1992 | Matsubara et al. . | |
| 5,504,029 | 4/1996 | Murata et al. . | |
| 5,569,880 | 10/1996 | Galvagni et al. . | |
| 5,576,925 | 11/1996 | Gorowitz et al. . | |
| 5,812,363 | 9/1998 | Kuroda et al. . | |
| 5,835,338 | 11/1998 | Suzuki et al. . | |
| 5,905,628 | 5/1999 | Okuni et al. | 361/303 |

*Primary Examiner*—Kristine Kincaid
*Assistant Examiner*—Eric Thomas
*Attorney, Agent, or Firm*—Dority & Manning

[57] ABSTRACT

Surface mount capacitors are made having ultra-small dimensions of length, width and height. For example, capacitors of 0402 size and smaller may be produced having lower height than has been achieved in the prior art. The components have L-shaped terminations on respective ends thereof, providing bottom lands for mounting to a circuit board. At most, the component will have top lands of negligible size to provide a large gap width between the terminations across the top surface of the component. In some embodiments, the top surface may also include orientation indicia located thereon. The invention also provides improved methodology for terminating a capacitor or other surface mount component.

18 Claims, 4 Drawing Sheets

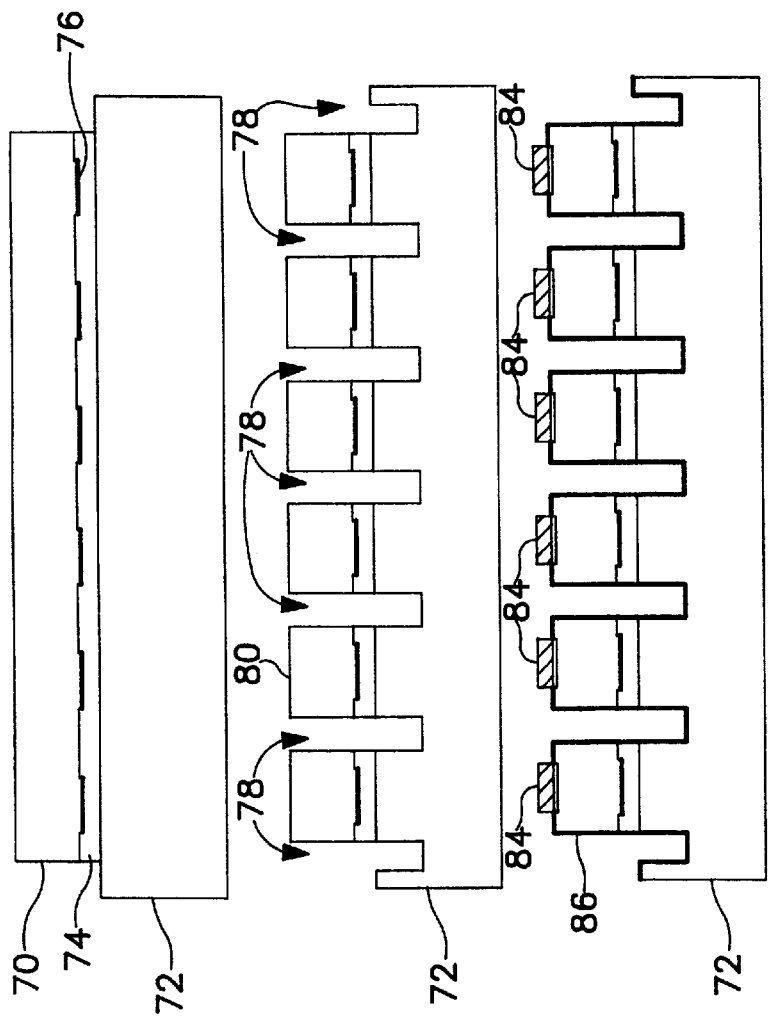
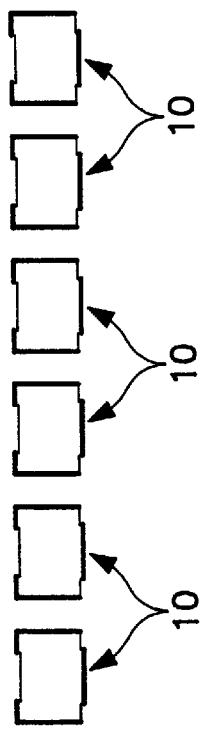
FIG. 5A
FIG. 5B
FIG. 5C
FIG. 5D

MINIATURE SURFACE MOUNT CAPACITOR AND METHOD OF MAKING SAME

CROSS-REFERENCE TO A RELATED APPLICATION

This application is based on a Provisional Application filed Nov. 24, 1997 and having Ser. No. 60/066,505.

BACKGROUND OF THE INVENTION

The present invention relates generally to small electronic components adapted to be surface mounted on a larger circuit board. More particularly, the invention relates to a surface mount capacitor device for use in a variety of applications.

According to industry practice, the size of a surface mount component is generally expressed as a number "XXYY," with XX and YY being the length and width, respectively, in hundredths of an inch. Urged on by general miniaturization trends in electronic devices, considerable effort has been expended over the years to provide surface mount components of ever smaller size. For example, the marketplace currently offers surface mount RF/Microwave capacitors of sizes as small as 0402.

Despite the miniaturization that has occurred, however, further need exists for devices that are even smaller. For example, it would be desirable to provide 0402 size capacitors having less height than those currently available on the market. In addition, RF/Microwave capacitors of smaller width-length dimensions would also be very useful.

SUMMARY OF THE INVENTION

The present invention recognizes various disadvantages of prior art constructions and methods. Accordingly, it is an object of the present invention to provide novel surface mount components.

It is a particular object of the present invention to provide very small surface mount capacitor devices.

It is a more particular object of the present invention to provide very small surface mount capacitor devices having an improved termination structure.

It is a further object of the present invention to provide novel techniques for manufacturing surface mount electronic components.

Some of these objects are achieved by a surface mount capacitor device comprising a device body having substantially L-shaped terminations located thereon. The device body includes an insulating substrate, such as glazed alumina, having a top surface and a bottom surface. A first conductive pattern in the form of a first capacitor plate is defined above the top surface of the substrate. A dielectric layer is located on top of the conductive pattern. A second conductive pattern, defining a second capacitor plate in registry with said first capacitor plate, is located on the dielectric layer. A cover layer is located above the second capacitor plate and sealed thereto.

Other objects of the invention are achieved by an improved method of terminating a plurality of surface mount components, such as capacitors. A wafer is provided from which a plurality of components may be produced by dicing in perpendicular dimensions. The wafer is mounted to a carrier by any appropriate technique, such as by a suitable glue. A series of parallel channels are cut through the wafer in a first direction at locations where terminations will be applied. The terminations are then applied, after which a series of cuts are made through the wafer in a second direction perpendicular to the first direction. The individual component devices are then removed from the carrier.

Other objects, features and aspects of the present invention are provided by various combinations and subcombinations of the disclosed elements, as well as methods of practicing the same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which:

FIGS. 5A through 5D diagrammatically illustrate various steps of terminating a plurality of surface mount component devices according to the present invention.

Figure 1:
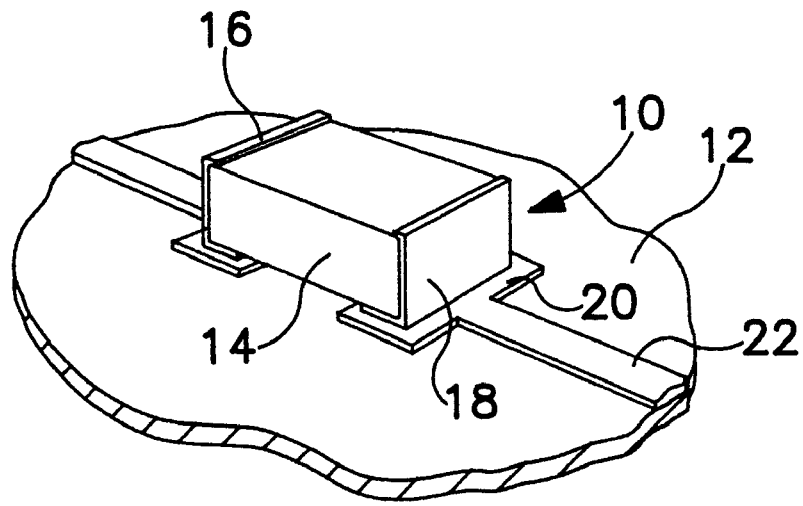
FIG. 1 is a perspective view of a surface mount capacitor device of the present invention as mounted to a printed circuit board.

Repeat use of reference characters in the present specification and drawings is intended to represent same or analogous features or elements of the invention.

DETAILED DESCRIPTION OF PREFERRED EMBODIMENTS

It is to be understood by one of skill in the art that the present discussion is a description of exemplary embodiments only, and is not intended as limiting the broader aspects of the present invention, which broader aspects are embodied in the exemplary constructions.

The present invention provides surface mount component devices having various advantageous features in comparison to the prior art. For example, thin film capacitor devices may be made in smaller sizes, and with less height, than has been provided in the past. In addition, devices of the present invention may exhibit highly uniform dimensional characteristics. The L-shaped termination structure utilized in exemplary embodiments reduces shorting that could otherwise occur during the surface mounting process.

Referring now to FIG. 1, capacitor 10 is shown as it may appear when surface mounted to a printed circuit board 12. Capacitor 10 includes a device body 14 having terminations 16 and 18 applied to opposite ends thereon. The terminations are attached to board 12 at respective mounting pads, such as pad 20. Conductive traces, such as trace 22, may be defined on the top surface of circuit board 12 using known microstrip techniques. As shown, the conductive traces extend from a respective mounting pad to provide electrical communication with other circuitry.

Figure 2:
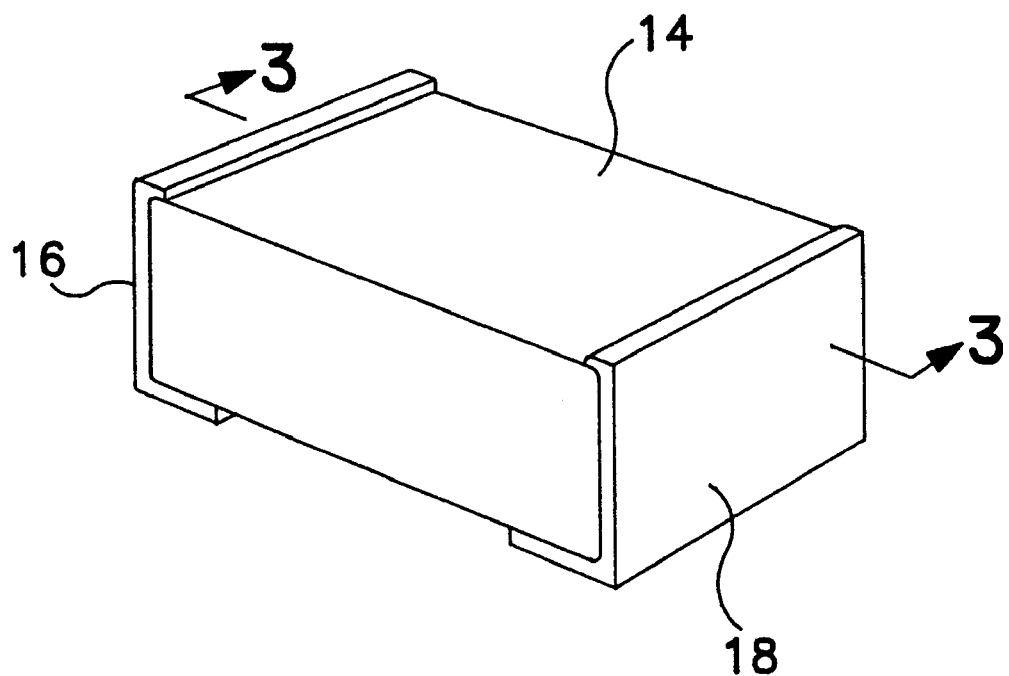
FIG. 2 is an enlarged perspective view of the surface mount capacitor device of FIG. 1.

As shown in FIG. 2, device body 14 will often be rectangular, defining a longer length dimension and a shorter width dimension. Preferably, device body 14 will also have a height dimension less than its width. As can be seen, terminations 16 and 18 do not extend around the lateral sides of device body 14.

The termination structure and various other aspects of capacitor 10 can be most easily explained with reference to FIG. 3. As shown, terminations 16 and 18 have respective main lands 24 and 26 located on the end faces of device body 14. When installed, capacitor 10 will rest on respective mounting (or "bottom") lands 28 and 30, which integrally extend "under" device body 14 as shown. The "top" lands 32 and 34 are due to solder creep during the manufacturing process, and typically will not have a width exceeding 0.05 mm. As such, the top lands can generally be neglected.

As understood by those of ordinary skill in the art, "length" of capacitor 10 is the distance of device body 14 between the main lands 24 and 26, "width" thereof is the distance between uncovered lateral sides of device body 14, and "height" thereof is the distance between respective bottom and top land pairs 28/32 and 30/34 (although the existence of the top lands is negligible).

During the manufacturing process, capacitor 10 is built up in an orientation inverted from that in which it is typically installed. Thus, device body 14 includes a rigid base layer 36 of alumina or the like. In such embodiments, a glaze layer 38 may be located adjacent base layer 36 to form the substrate base. A first electrode 40 is formed adjacent glaze layer 38. A second electrode 42 is formed opposite first electrode 40 adjacent an interposing dielectric layer 44. As can be seen, first electrode 40 extends to termination 18, whereas second electrode 42 extends to termination 16. A "cover" layer 46, preferably made of alumina or a like rigid material, is applied to the resulting structure via a layer 48 of epoxy or other appropriate adhesive.

In addition to the various layers described above, capacitor 10 will preferably include a first passivation layer between glaze layer 38 and electrode 40 to promote adhesive thereof. A second passivation layer may also be applied between electrode 42 and glue layer 48. Preferably, silicon oxynitride or silicon oxide may be used to form these passivation layers. In the preferred embodiment, electrodes 40 and 42 may be aluminum with dielectric layer 44 being silicon oxide or silicon oxynitride.

Figure 4:
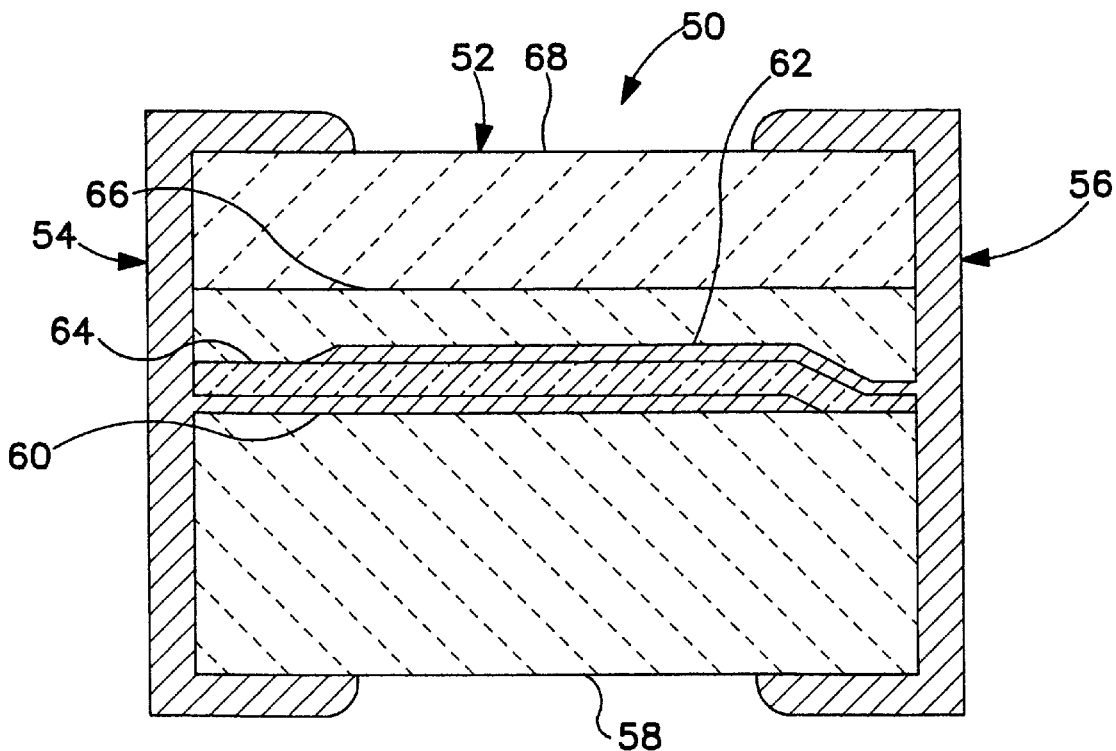
FIG. 4 is a cross sectional view similar to FIG. 3 of a prior art capacitor device.

FIG. 4 illustrates a structure that has been utilized in the production of miniature capacitor devices of the prior art. As can be seen, capacitor 50 includes a capacitor body 52 having U-shaped terminations 54 and 56 applied to each end thereof. Capacitor body 52 includes a glass substrate 58 onto which a first aluminum electrode 60 is located. A second aluminum electrode 62 is located over an interposing dielectric layer 64 of silicon oxide or silicon oxynitride. A layer of silicon oxynitride passivation (not shown) may then be applied over electrode 62. Finally, a layer 66 of epoxy is applied to maintain a glass cover 68.

For purposes of comparison, Table I below shows the various layer thicknesses in an exemplary 0402 capacitor of the invention as in FIG. 3 and a 0603 capacitor of the prior art as in FIG. 4.

TABLE I

Figure 3:
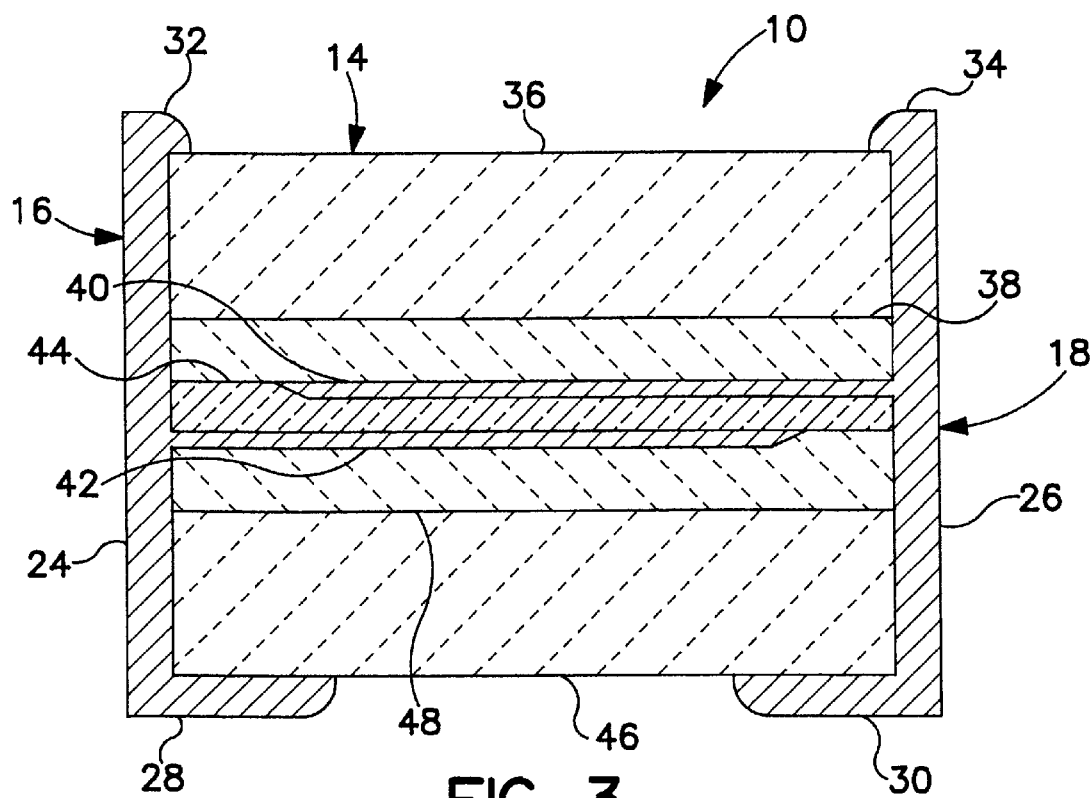
FIG. 3 is a cross sectional view as taken along line 3—3 of FIG. 2.

| FIGURE 3 INVENTION | FIGURE 4 PRIOR ART |
|---|---|
| Base Layer 36 Plus Glaze Layer 38: 0.3 mm | Glass Substrate 58: 0.4 mm |
| Preliminary Passivation: 0.3 μm | Not applicable |
| Electrode 40: 2.5 μm | Electrode 60: 2.5 μm |
| Dielectric 44: 0.9–3.0 μm | Dielectric 64: 0.9–3.0 μm |

TABLE I-continued

| FIGURE 3 INVENTION | FIGURE 4 PRIOR ART |
|---|---|
| Electrode 42: 3.0 μm | Electrode 62: 3.0 μm |
| Top Passivation: 1.5 μm | Top Passivation: 1.5 μm |
| Epoxy Layer 48: 2.0–10.0 μm | Epoxy Layer 66: 5.0–20.0 μm |
| Cover Layer 46: 0.1 mm | Glass Cover: 0.21 mm |

Typically, capacitor devices of the present invention will be one of many manufactured in a larger wafer produced by thin film techniques. For example, the various electrodes may be formed by photolithography as the wafer is built up. Thin film techniques for producing such a wafer are described in U.S. Pat. No. 4,453,199 to Ritchie et al., incorporated herein by reference.

Due to the inherent rigidity of wafers produced according to the present invention, a completed wafer may be lapped to achieve a desired final thickness. This lapping step eventually yields a capacitor having a lower height than other capacitors that have been made in the past in the same component size. For example, many prior art thin film capacitors of 0402 size will have a height of up to about 0.55 mm. According to the present invention, capacitors may be produced in this size having a nominal height of only about 0.40 mm (typically 0.40±0.05 mm). Capacitors may be produced in 0201 size having an ultra-small height of only about 0.16 mm (typically 0.16±0.02 mm) or less.

Because of the U-shaped termination structure utilized by the prior art capacitor of FIG. 4, height-width orientation is required in the tape and reel packaging process. In addition to height-width orientation, the L-shaped terminations of the present invention require top-bottom orientation. As such, the "top" of the individual capacitors includes an orientation mark, such as may be produced by printing on this side of the wafer.

The present invention further provides a novel method of applying terminations to the individual capacitors of the wafer. Referring now to FIG. 5A, such a wafer 70 is first attached to a larger carrier 72, which may be a glass sheet. Wafer 70 is preferably bonded to carrier 72 using a temporary glue 74, such as a glue cured by UV light. It can be seen that the wafer is oriented such that the "top" orientation marks, e.g., mark 76, will be inverted during application of the terminations.

Next, as shown in FIG. 5B, a series of parallel cuts are defined by conventional techniques through wafer 70 in a first direction. As a result, a series of capacitor array strips, such as strip 80, are produced on carrier 72. The channels 78 between the array strips may then be roughened, such as by sandblasting, to improve termination adhesion to the main land areas (i.e., the channel walls), and subsequently cleaned by chemical treatment.

Figure 6:
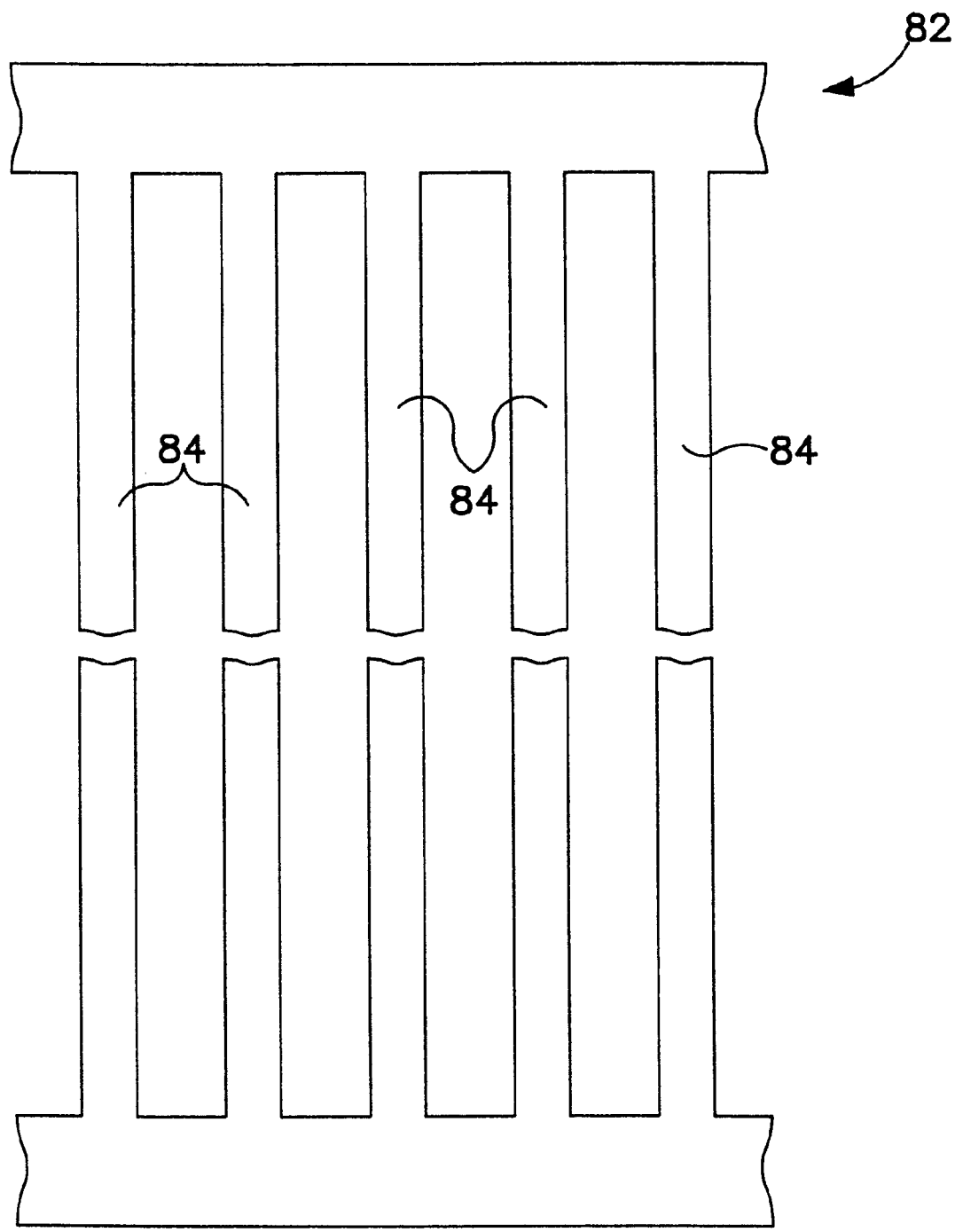
FIG. 6 is an enlarged plan view of a portion of a shadow mask for use in terminating a plurality of surface mount component devices according to the present invention.

Referring now to FIG. C, a shadow mask is next placed over the series of array strips mounted to carrier 72. As can be seen in FIG. 6, the shadow mask 82 includes parallel masking members 84 having a width substantially equal to the desired gap between termination lands on the "bottom" of the resulting capacitor.

With the shadow mask in position, main (principal) and bottom land portions of the terminations are applied in single sputtering run, as indicated at 86. Preferably, the sputtering is accomplished in a high-vacuum machine by deposition of two layers, such as Cr and Cu, wherein the thickness of the "bottom" land is achieved by direct sputtering and wherein the main (principal) land thickness results by scattering within the channel. An electroless nickel coating from NiB composition may then be applied to form a barrier layer before solder application.

After the terminations are applied, the array strips are diced in a second direction, perpendicular to the first direction, to yield the individual capacitors 10. Referring to FIG. 5D, capacitors 10 are then removed from carrier 72 by dissolution or ungluing of the temporary glue. Typically, this will be accomplished using a special solvent that acts on the glue in this manner. A barrel plating or other soldering process of nickel and SnPb may then be employed.

For purposes of comparison, Table II below sets forth various details of a preferred termination structure in an exemplary 0402 capacitor of the invention as in FIG. 3 and a 0603 capacitor of the prior art as in FIG. 4.

TABLE II

| LAYER | FIGURE 3 INVENTION | FIGURE 4 PRIOR ART |
| --- | --- | --- |
| Flash I | Not Applicable | Aluminum 0.01 $\mu$m |
| Flash II | Chromium 0.1–0.4 $\mu$m | Chromium 0.1 $\mu$m |
| Shaping Layer | Copper 1.0–4.0 $\mu$m | Copper 1.0 $\mu$m |
| Barrier I | Nickel-Boron 1.0–2.5 $\mu$m | Nickel-Boron 1.0 $\mu$m |
| Barrier II | Nickel 2.0–8.0 $\mu$m | Not Applicable |
| Solder | Tin-Lead 3.0–12.0 $\mu$m | Tin-Lead 10.0–50.0 $\mu$m |

It will be appreciated that the process described above yields surface mount components that are effectively terminated at smaller sizes. Often, it has been difficult to efficiently terminate smaller sizes by sputtering of individual strips since narrow strips become fragile, and are thus susceptible to breakage. Termination by dipping into a silver paste and sintering at around 700° C. is not applicable for an aluminum-dielectric-aluminum thin film structure.

Methodology of the present invention also generally produces terminations of improved dimensional tolerance in comparison with the prior art. In particular, the lands may have improved uniformity in width with respect to prior art structures of similar size, while desirably exhibiting a bigger land gap.

For example, capacitors produced in 0402 size according to the present invention may have "bottom" lands with a nominal width of about 0.20 mm (typically 0.20±0.10 mm). In such a structure, the "bottom" lands may be separated by a nominal gap of about 0.35 mm or more, with the negligible "top" lands having a nominal gap of at least about 0.85 mm (typically 0.80 to 1.05 mm). This is in comparison to prior art components of the same size, where the land width may nominally be about 0.25 mm with a nominal gap width of about 0.30 mm.

A still further advantage in comparison with the prior art is achieved by exemplary capacitors produced according to the present invention. Specifically, the reduced height and extremely uniform thin cover layer as described above result in a thin film structure which is very close to the printed circuit board when the capacitor device is mounted thereon. As a result, the device will exhibit superior uniformity in self resonance frequency (SRF).

It can thus be seen that the present invention provides novel structures adapted for use as surface mount components. While preferred embodiments of the invention have been shown and described, modifications and variations may be made thereto by those of ordinary skill in the art without departing from the spirit and scope of the present invention. For example, devices may be made in various component sizes other than those specifically discussed, such as 1206, 0805 and 0603. Furthermore, while capacitors are specifically discussed above, the described termination technique can also be employed with other surface mount components, such as inductors, resistors, fuses and the like.

It should also be understood that aspects of the various embodiments may be interchanged both in whole or in part. Furthermore, those of ordinary skill in the art will appreciate that the foregoing description is by way of example only, and is not intended to be limitative of the invention set forth in the appended claims.

What is claimed is:

1. A thin film capacitor device for mounting to a surface, said capacitor device comprising a device body having small dimensions in length, width and height, and having substantially L-shaped terminations located thereon with portions of said terminations extending over a bottom surface of said device body and negligibly over a top surface of said device body, said device body including:

an insulating substrate having a top surface and a bottom surface;

a first conductive pattern located above said top surface of said substrate and defining a first polarity capacitor plate;

a dielectric layer located on top of said first conductive pattern;

a second conductive pattern located on said dielectric layer, said second conductive pattern defining a second capacitor plate in registry with said first capacitor plate; and a planar cover layer located above said second conductive pattern.

2. A thin film capacitor device as set forth in claim 1, further comprising orientation indicia located on a top surface of said device body.

3. A thin film capacitor device as set forth in claim 1, wherein said device body has a size of 0402 or less.

4. A thin film capacitor device as set forth in claim 3, wherein said device body has a nominal height of no greater than about 0.40 mm.

5. A thin film capacitor device as set forth in claim 1, wherein said cover layer comprises a rigid layer of insulative material sealed to said second conductive pattern.

6. A thin film capacitor device as set forth in claim 5, wherein said cover layer has a thickness of about 0.1 mm.

7. A thin film capacitor device as set forth in claim 5, wherein said cover layer is sealed to said second conductive pattern by an interposing epoxy layer.

8. A thin film capacitor device as set forth in claim 7, wherein said insulating substrate comprises a planar alumina substrate.

9. A thin film capacitor device as set forth in claim 8, wherein said planar alumina substrate comprises a substrate of glazed alumina.

10. A thin film capacitor device as set forth in claim 1, wherein said first conductive pattern and said second conductive pattern each comprise aluminum.

11. A thin film capacitor device as set forth in claim 10, wherein said dielectric layer comprises material selected from a group consisting of silicon oxide and silicon oxynitride.

12. A capacitor device for mounting to a surface, said capacitor device comprising:

a device body of a small size no greater than 0402 and a nominal height of no greater than about 0.40 mm;

said device body having a capacitor structure located therein, said capacitor structure being formed of at least one first polarity electrode and at least one second polarity electrode separated by an interposing layer of dielectric; and substantially L-shaped terminations located on opposite end surfaces of said device body, with portions of said terminations extending over a bottom surface of said device body and negligibly on a top surface of said device body.

13. A capacitor device as set forth in claim 12, further comprising orientation indicia located on a top surface of said device body.

14. A capacitor device as set forth in claim 13, wherein said device body has a size of no greater than about 0201.

15. A capacitor device as set forth in claim 14, wherein said device body has a nominal height of no greater than about 0.16 mm.

16. A capacitor device as set forth in claim 12, wherein a nominal gap width between said terminations across a top surface of said device body is at least about 0.85 mm.

17. A capacitor device as set forth in claim 12, wherein a nominal gap width between said terminations across a bottom surface of said device body is at least about 0.35 mm.

18. A capacitor device as set forth in claim 12, wherein said capacitor structure is formed as an aluminum-dielectric-aluminum thin film structure.

\* \* \* \* \*